United States Patent [19]

Baliga et al.

[11] Patent Number: 4,967,243

[45] Date of Patent: Oct. 30, 1990

[54] POWER TRANSISTOR STRUCTURE WITH HIGH SPEED INTEGRAL ANTIPARALLEL SCHOTTKY DIODE

[75] Inventors: Bantval J. Baliga, Clifton Park, N.Y.; Martin F. Schlecht, Lexington, Mass.

[73] Assignee: General Electric Company, Schenectady, N.Y.

[21] Appl. No.: 221,482

[22] Filed: Jul. 19, 1988

[51] Int. Cl.$^5$ ..................... H01L 27/02; H01L 29/72
[52] U.S. Cl. ..................... 357/23.4; 357/43; 357/34; 357/36
[58] Field of Search ..................... 357/23.4, 43, 34, 36, 357/15

[56] References Cited

U.S. PATENT DOCUMENTS

| | | | |
|---|---|---|---|
| 3,391,311 | 7/1968 | Lin | 357/34 |
| 4,441,117 | 4/1984 | Zommer | 357/43 |
| 4,521,795 | 6/1985 | Coe | 357/23.4 |
| 4,605,948 | 8/1986 | Martinelli | 356/34 |
| 4,641,174 | 2/1987 | Baliga | 357/58 |
| 4,783,693 | 11/1988 | Alzati et al. | 357/36 |

OTHER PUBLICATIONS

B. J. Baliga, *Modern Power Devices*, John Wiley & Sons, 1987, pp. 263–342.
Ser. No. 186,983, Ngo et al., 4/27/88.

*Primary Examiner*—Rolf Hille
*Assistant Examiner*—Wael Fahmy
*Attorney, Agent, or Firm*—Marvin Snyder; James C. Davis, Jr.

[57] ABSTRACT

A power semiconductor device which comprises either a bipolar transistor or a MOSFET, incorporates an integral Schottky diode in antiparallel connection with the transistor for conducting reverse current through the power semiconductor device. By fabricating the diode to exhibit a lower turn-on voltage, than the P-N junction at the base and collector interface in the bipolar transistor, or at the base and drift layer interface in the MOSFET, the power semiconductor device, when in the reverse conduction mode, exhibits excellent reverse recovery characteristics and without forward voltage overshoot transients.

7 Claims, 4 Drawing Sheets

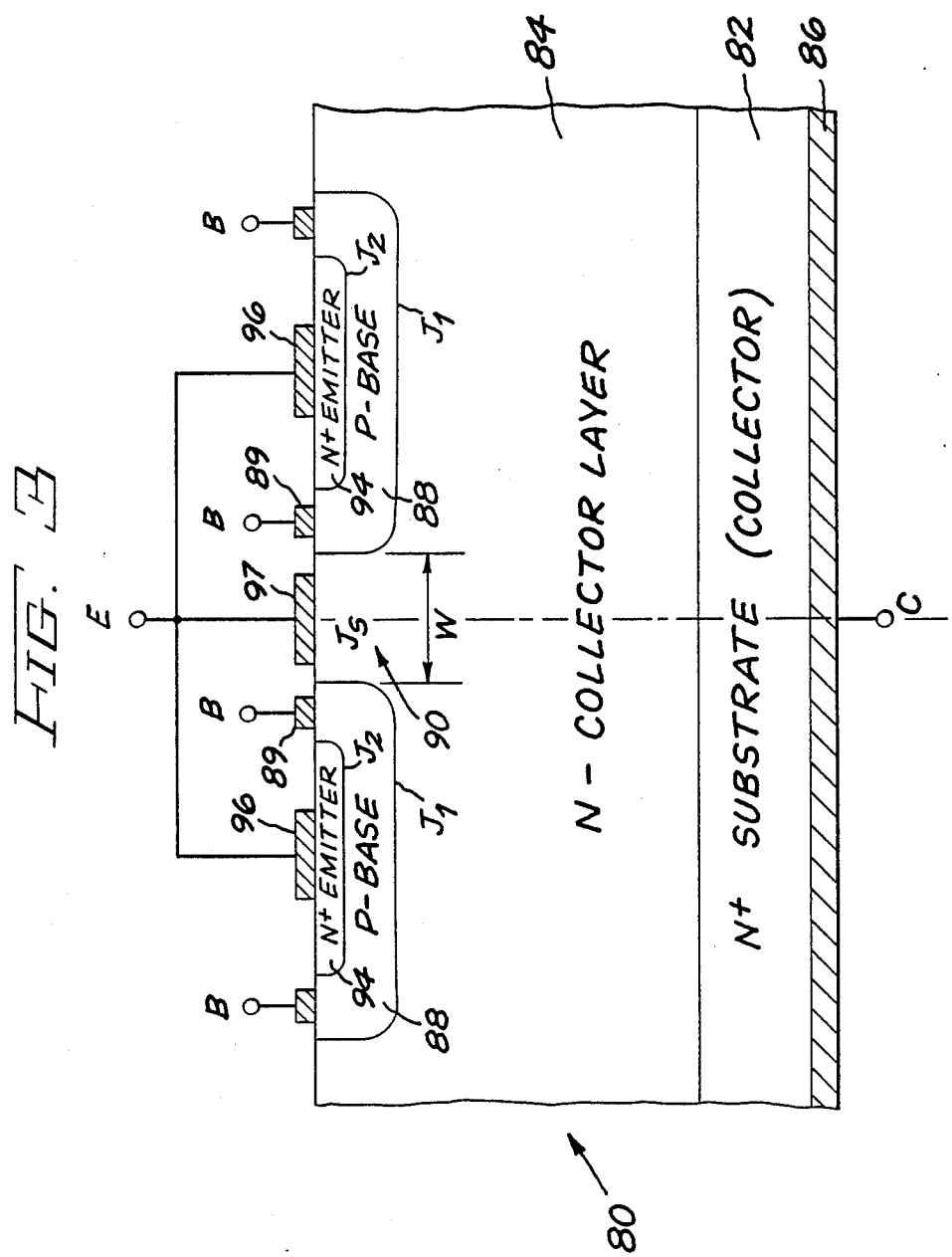

POWER TRANSISTOR STRUCTURE WITH HIGH SPEED INTEGRAL ANTIPARALLEL SCHOTTKY DIODE

RELATED APPLICATION

A copending U.S. patent application Ser. No. 220,649 entitled "Power Bipolar Device With Integral Antisaturation Diode" contains subject matter related to the subject matter of the present application and is incorporated herein by reference. This related application filed July 18, 1988 for B. J. Baliga and M. F. Schlect and is assigned to the assignee hereof.

FIELD OF THE INVENTION

The present invention relates to power transistor devices including metal oxide semiconductor field effect transistors (MOSFETs) and bipolar transistors, which contain an integral Schottky barrier for conducting reverse current without minority carrier injection.

BACKGROUND OF THE INVENTION

Power MOSFET devices are used in a variety of applications including audio/radio frequency circuits and high frequency inverters.

A typical power MOSFET is a vertical semiconductor device comprising an N+ substrate having a drain electrode on its lower surface. An N-drift layer is formed on the upper surface of the substrate. Diffused into the N-drift layer are one or more P-base regions. The P-base regions extend beneath a gate electrode situated atop an insulating layer which illustratively comprises silicon oxide on the upper surface of the substrate. One or more heavily doped N+ source regions are diffused into each base region. The N+ source regions are in contact with source electrodes.

The power MOSFET can operate in a forward conducting mode and a forward blocking mode. In the forward blocking mode, the gate and source electrodes are short-circuited. If a positive voltage is then applied to the drain electrode, the P-base/N-drift layer junctions are reverse biased and current flow is blocked. To carry current from drain to source in the power MOSFET (i.e., the forward conducting mode), it is necessary to form a conductive path extending between the N+ source regions and the N-drift region. This can be accomplished by applying a positive gate bias to the gate electrode. The resulting electric field attracts electrons to the surface of the P-base regions underneath the gate. The electric field is sufficient to create a surface electron concentration that overcomes the P-base doping in one or more narrow channels underneath the gate to provide a conductive path between the N+ source regions and the N-drift region. Now, the application of a positive drain voltage induces current flow between the drain and source electrodes through the N-drift region and the conducting channels formed in the P-base region. This current flow occurs solely by the transport of majority carriers. To switch the power MOSFET from the forward conducting to the forward blocking mode the gate bias is removed. When the gate bias is removed, electrons are no longer attracted to the region underneath the gate and the conductive path between drain and source is broken.

Some power switching circuits require provision for reverse current in active power switching devices. Some examples of these types of circuits are DC to AC inverters for adjustable speed motor drives, switching power supplies, and AC to DC choppers for motor speed control with regenerative braking. When using bipolar transistors, a diode connected in anti-parallel with the transistor has been used to conduct the reverse current. Illustratively, this diode is formed across the P-base/N-drift layer junction which forms an integral part of the power MOSFET discussed above. The anode current of the diode flows through the source electrodes which are in contact with the P-base regions. If the P-base/N-drift layer junction is forward biased, conduction takes place from source to drain through the injection of minority carriers into the drift layer.

The primary difficulty with using the integral diode of the power MOSFET is poor reverse recovery characteristics. Reverse recovery is the process whereby the diode is switched from its on state to its blocking state. To undergo this transition, the minority carrier charge stored in the drift layer during conduction must be removed. The stored charge removal occurs by means of two phenomena—the flow of a large reverse current, followed by recombination. The diodes integral with power MOSFET devices often exhibit very slow reverse recovery and very large reverse recovery currents. The reverse recovery current imposes power dissipation and thermal stress on various circuit components external to the power MOSFET.

Improvement of the reverse recovery characteristics of the integral diode in a power MOSFET was first accomplished by using election irradiation to introduce recombination centers into the drift layer. During reverse recovery, the lifetime reduction resulting from the irradiation can greatly reduce both the reverse recovery current and the recovery time. The reverse recovery characteristics can also be improved by gold or platinum doping of the drift layer to introduce recombination centers.

While the introduction of recombination centers into the drift region can improve the reverse recovery characteristics of the integral diode, the minority carriers stored in the drift region exhibit a sufficiently high lifetime that the resulting reverse recovery characteristics are not entirely satisfactory.

A further drawback to using an integral diode in the power MOSFET device is the forward voltage overshoot that occurs during the turn-on transient. This overshoot results from presence of the resistive drift layer. Under steady state reverse current conduction, the drift layer resistance is reduced by injected minority carriers. During high speed turn-on, however, the current rises at a faster rate than the diffusion of minority carriers injected from the junction. A high voltage drop develops across the drift region until the minority carriers can diffuse in and reduce the resistance.

A detailed discussion of conventional power MOSFET devices including use of an integral P-N junction to conduct reverse current and the drawbacks associated therewith may be found in B. J. Baliga, "Modern Power Devices", John Wiley & Sons, 1987, pp. 263–342.

Accordingly, it is an object of the present invention to provide a power MOSFET device with an integral diode for conducting reverse current, which diode exhibits very good reverse recovery and forward voltage overshoot characteristics.

As indicated above, it is sometimes necessary to accommodate reverse current in connection with use of a bipolar power transistor. This need may typically arise in motor control applications. Therefore, it is a further object of the invention to provide a bipolar transistor with an integral diode for conducting reverse current, which diode exhibits very good reverse recovery and forward voltage overshoot characteristics.

SUMMARY OF THE INVENTION

In an illustrative embodiment of the present invention, a power MOSFET is constructed so that the drift layer directly contacts the metallic source electrode to form a Schottky barrier therewith. Forward current transport through a Schottky barrier occurs primarily through majority carriers. As a result, the Schottky barrier exhibits extremely fast reverse recovery characteristics without forward voltage overshoot transients. The height of the Schottky barrier is chosen smaller than the forward bias voltage of the integral P-N junction so that reverse conduction through the MOSFET (i.e., forward conduction through the Schottky barrier) may be achieved without turning on the integral P-N junction diode. This prevents injection of minority carriers into the drift region from the P-base. The resulting power MOSFET thus incorporates an integral diode for conducting reverse current and exhibits very fast reverse recovery characteristics without forward voltage overshoot transients. In an alternative embodiment of the invention, a bipolar power transistor includes an integral Schottky barrier for conducting reverse current.

BRIEF DESCRIPTION OF THE DRAWINGS

FIG. 3 schematically illustrates, in cross-sectional view, two cells of a power bipolar transistor with an integral Schottky barrier, on either side of a centerline, for accommodating reverse current.

DETAILED DESCRIPTION OF THE INVENTION

Figure 1A:
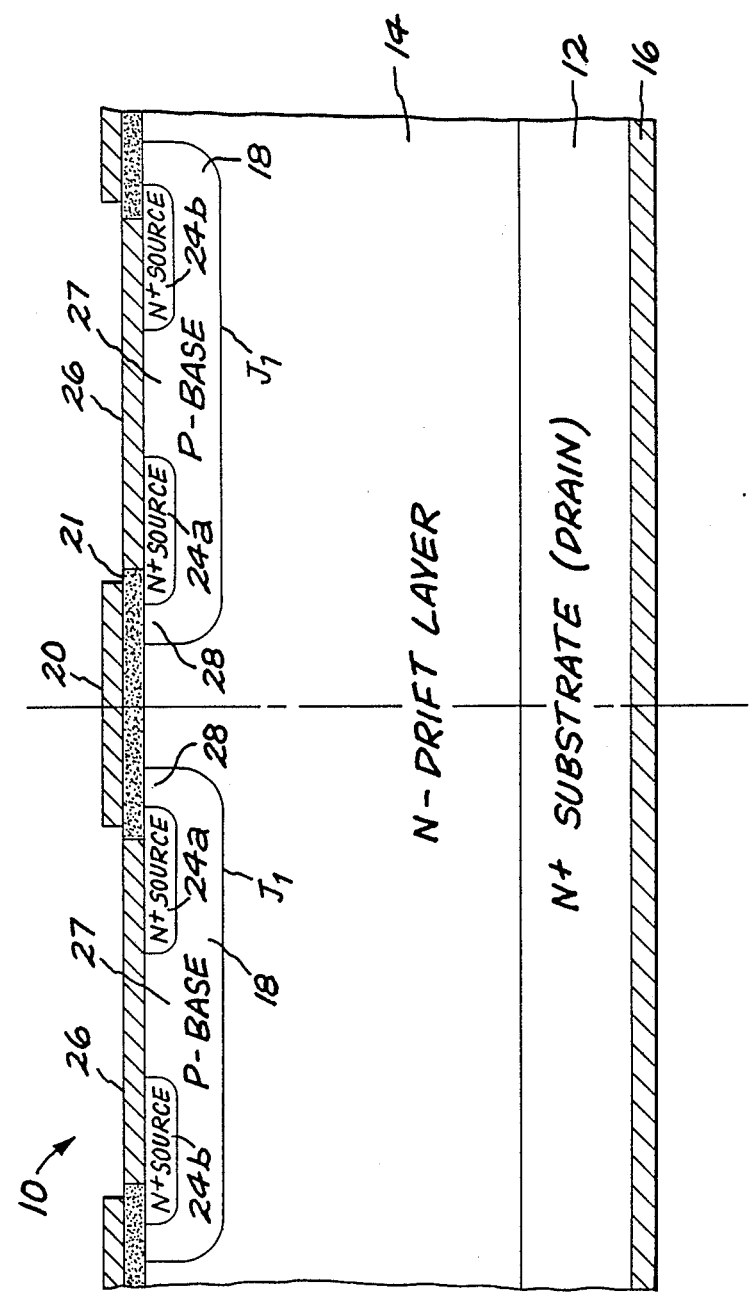
FIG. 1A schematically illustrates, in cross-sectional view, two cells of a prior art power MOSFET, on either side of a centerline, which includes an integral P-N junction for conducting reverse current.

Before discussing the inventive device comprising a power transistor with integral Schottky diode for conducting reverse current, a prior art power MOSFET device, illustrated in FIG. 1A, should be considered. The MOSFET FIG. 1A is a discrete vertical MOS device fabricated by planar diffusion techniques and known as a DMOS device.

MOSFET 10 of FIG. 1A comprises a heavily doped N+ substrate 12 which serves as a drain region. A metallic drain electrode 16 is included on the bottom surface of substrate 12. An epitaxially-grown N-type drift layer 14 is situated on the top surface of substrate 12. A P-base region 18 is diffused into N-drift layer 14. A gate electrode 20 extends over the P-base region and is electrically insulated therefrom by a layer of insulation 21, so as to constitute an insulated gate electrode. Illustratively, gate electrode 20 comprises a metallic layer while insulating layer 21 comprises silicon dioxide. A heavily doped N+ source region is diffused into P-base region 18 and contacted by a source electrode 26. The source region is made up of two spaced portions 24a and 24b, enabling P-base region 18 to directly contact a source electrode 26 through a separation 27 between N+ source regions 24a and 24b. This is important for establishing a fixed potential in the P-base region during device operation.

The portion of P-base region 18 underneath gate 20 defines surface channel region 28. If gate electrode 20 is externally short-circuited to source electrode 26, the carrier concentration in channel region 28 is determined by the doping level of P-base region 18. When drain electrode 16 is biased positive with respect to source electrode 26, junction $J_1$ between P-base region 18 and drift layer 14 is reverse biased, so that the device thus exhibits forward blocking capability.

To carry current from drain to source (i.e., the forward conduction mode) in device 10, it is essential to form a conducting path between N+ source regions 24 and N-drift region 14. This is accomplished by applying a positive bias to gate electrode 20. The gate bias modulates the conductivity of channel region 28 by a strong electric field created normal to the semiconductor surface through oxide layer 21. The field strength must be sufficient to create a surface electron concentration which overcomes the concentration of P-type dopant in channel region 28. The resulting N-type surface layer in channel 28 provides a conductive path between N+ source region 24 and N-drift layer 14, resulting in current flow between drain electrode 16 and source electrode 26 through N-drift layer 14 and channel 28. To switch device 10 into the off state, the gate bias voltage may be reduced to zero by externally short-circuiting gate electrode 20 to source electrode 26. When the gate voltage is removed, electrons are no longer attracted into channel 28 and the conductive path from drain electrode 16 to source electrode 26 is broken.

For applications of device 10 that require a reverse current flow (i.e., from source to drain), the device includes an integral P-I-N diode-like structure which, when forward biased, conducts reverse current. The P-I-N diode-like structure comprises P-base region 18, drift layer 14 and N+ substrate 12. When this diode structure is forward biased, the reverse current can flow from source electrode 26 to drain electrode 16.

Figure 1B:
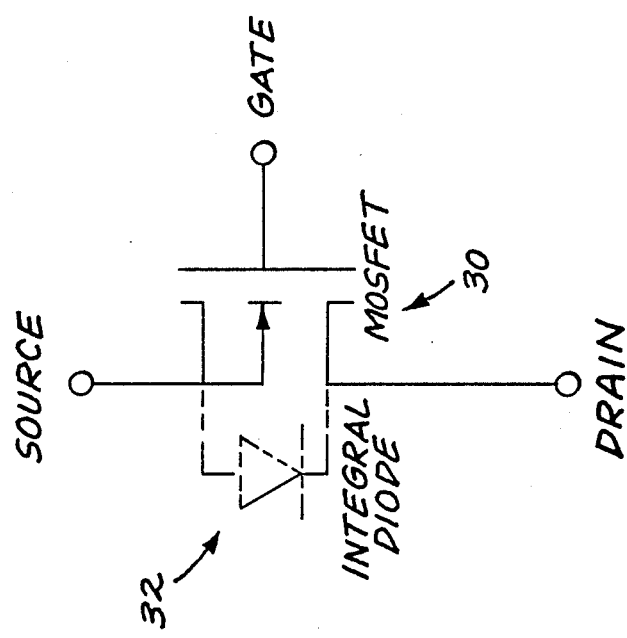
FIG. 1B is a schematic diagram of the equivalent circuit of the MOSFET of FIG. 1.

FIG. 1B is the equivalent circuit for device 10 of FIG. 1A. The equivalent circuit comprises a MOSFET 30 including source, drain and gate terminals, and an integral diode 32 shown in phantom. The anode of diode 32 is connected to the source terminal of MOSFET 30 and the cathode of the diode is connected to the drain terminal of MOSFET 30.

When device 10 of FIG. 1A is in the reverse conduction mode, junction $J_1$ is forward biased and minority carriers are injected from P-base 18 into N-drift layer 14. Thus the integral diode in prior art power MOSFET 10 has unsatisfactory reverse recovery and forward overshoot characteristics.

Figure 2B:
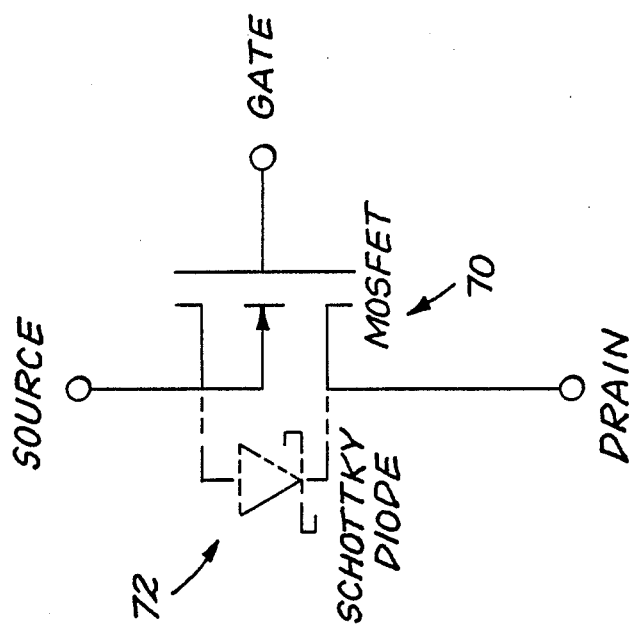
FIG. 2B is a schematic diagram of the equivalent circuit of the MOSFET of FIG. 2A.
Figure 2A:
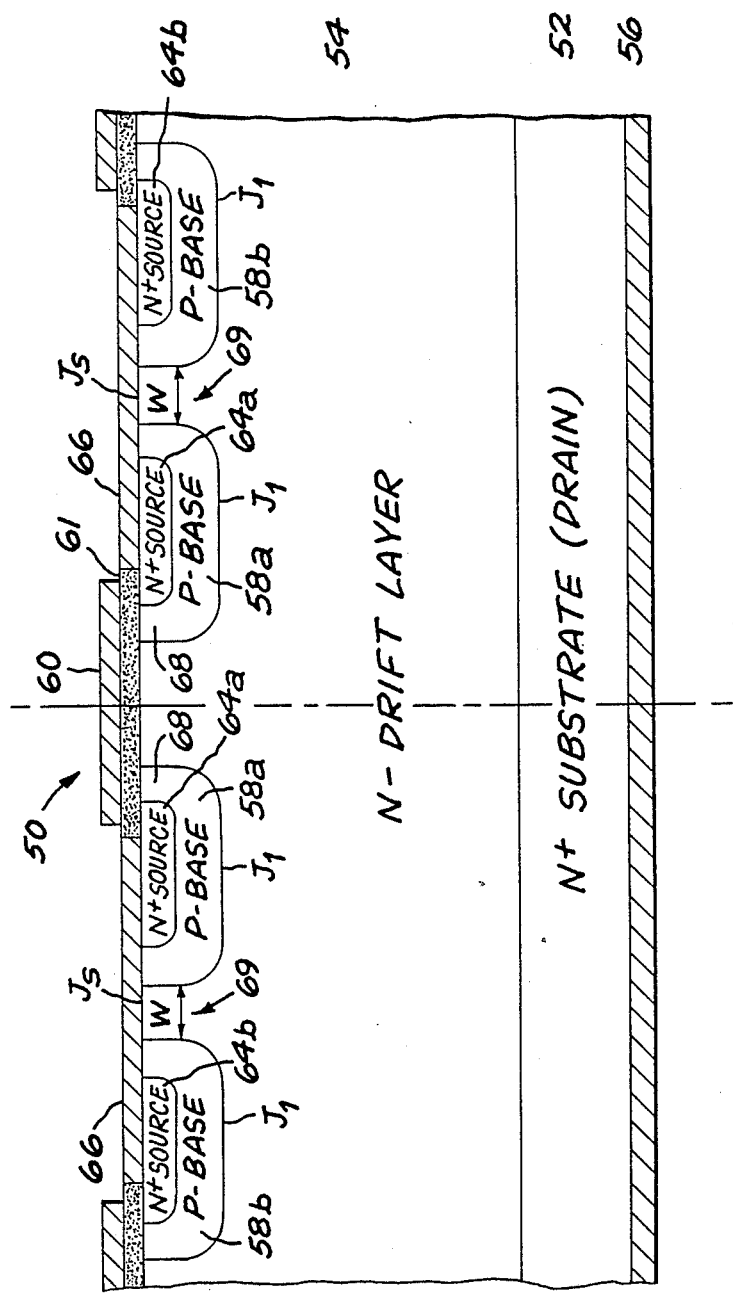
FIG. 2A schematically illustrates, in cross-sectional view, two cells of a power MOSFET with an integral Schottky barrier, on either side of a centerline, in accordance with an illustrative embodiment of the present invention.

A power MOSFET device 50 in accordance with an illustrative embodiment of the present invention is shown in FIG. 2A. The device includes an integral Schottky barrier diode for conducting reverse current. Since the Schottky barrier is primarily a unipolar device and does not rely on injection of minority carriers in its conducting state, the reverse current mode of device 50 exhibits excellent reverse recovery characteristics without forward voltage overshoot. In particular, the structure of device 50 of FIG. 2A is similar to the structure of device 10 of FIG. 1A except that the base region is divided into two portions so that the drift layer directly contacts the source electrode to form a Schottky barrier junction therewith.

Power MOSFET device 50 of FIG. 2A comprises an N+ substrate 52 with a metallic drain electrode 56 included on the bottom surface of the substrate. An epitaxially-grown N-drift layer 54 is situated on the top surface of substrate 52. A plurality of P-base regions 58a and 58b are diffused into the surface of drift layer 54 and are separated from each other by a distance W so that drift layer 54 can directly contact a metallic source electrode 66 and form Schottky barrier $J_s$ therewith. N+ source regions 64a and 64b are diffused into base regions 58a and 58b respectively, and each of the source regions is in contact with source electrode 66. P-base regions 58a and 58b are also in contact with source electrode 66 for the reasons stated in connection with the device of FIG. 1A. Device 50 of FIG. 2A includes a gate electrode 60 which extends over P-base region 58a and is electrically insulated therefrom by an insulating layer 61, so as to constitute an insulated gate electrode. Thus, as indicated above, drift layer 54 contacts the metallic source electrode and forms a Schottky barrier therewith.

In the forward blocking and forward conduction modes, device 50 of FIG. 2A operates similarly to device 10 of FIG. 1A. In the forward blocking mode, gate electrode 60 and source electrode 66 are externally short-circuited to each other. When a positive voltage is applied to drain electrode 56, junctions $J_1$ between N-drift layer 54 and each of P-base regions 58a and 58b are reverse biased. In particular, distance W is chosen so that in the forward blocking mode the depletion layers surrounding junctions $J_1$ pinch off the portion 69 of N-drift layer 54 between P-base regions 58a and 58b, suppressing leakage current from Schottky barrier $J_s$.

In the forward conducting mode, a positive voltage is applied to gate electrode 60. The gate-induced electric field attracts electrons into channel region 68 that overcomes the concentration of P-type dopant therein. The resulting N-type surface layer in channel 68 provides a conductive path between the N+ source regions and the N-drift layer. Now, when a positive voltage is applied to the drain electrode, forward current in the form of majority carrier transport flows between drain and source. No minority carriers are involved in the forward current.

By appropriate selection of distance W, the integral Schottky barrier diode is designed to have a turn-on voltage which is less than the turn-on voltage of junctions $J_1$ between the P-base regions and the N-drift layer. In the case of a silicon device, the turn-on voltage of the P-base/N-drift layer junctions is about 0.7 volts. Thus, the Schottky barrier height for the diode, in the case of a silicon device, should be chosen to be about 0.6 volts. This allows the Schottky barrier junctions to be turned on to conduct a reverse current without turning on the bipolar P-base/N-drift layer junctions. Accordingly, a reverse current can flow without minority carrier injection into the N-drift regions. This reverse current is limited by the N-drift layer resistance. Because the reverse current almost entirely comprises transport of majority carriers, the integral Schottky diode exhibits excellent reverse recovery characteristics without forward voltage overshoot transients.

The equivalent circuit for device 50 of FIG. 2A, as shown in FIG. 2B, includes a MOSFET 70 comprising source, gate and drain terminals and a Schottky diode 72. The anode of the Schottky diode is connected to the source terminal of MOSFET 70 and the cathode is connected to the drain terminal of MOSFET 70. Therefore, the equivalent circuit of FIG. 2A is similar to that of FIG. 1A, and yet the device of FIGS. 2A and 2B does not exhibit the undesirable reverse recovery and forward voltage overshoot characteristics of the prior art device of FIGS. 1A and 1B.

Typically, device 50 of FIG. 2A is fabricated of silicon. Illustratively, substrate 52 may have a thickness of 500 microns and a dopant concentration of $10^{20}$ per $cm^3$. Drift layer 54 may have a thickness of 10 microns and a dopant concentration of $10^{15}$ per $cm^3$. P-base portions 58a and 58b may be diffused to a depth of 2 microns and have a dopant concentration of $10^{17}$ per $cm^3$. Source regions 64a and 64b may be diffused to a depth of 1 micron and have a dopant concentration of $10^{20}$ per $cm^3$. Distance W may be about 5 microns. The drain electrode is comprised of nickel and the source electrode is comprised of aluminum.

Heretofore, device 50 has been described as being fabricated by starting with a heavily doped substrate 52 on which a less heavily doped layer 54 is epitaxially grown. However, it is also possible to fabricate devices of the type shown in FIG. 2A by starting with a wafer doped to a level corresponding to that of layer 54 and then diffusing a heavily doped region 52 on one side thereof for connection to a drain electrode.

In operation, reverse current (as well as forward current) in device 50 of FIG. 2A is limited by the resistance of N-drift layer 54. For example, a 2 amp, 2000 volt power MOSFET with an on resistance of 0.5 ohms would require an active area of 0.6 $cm^2$. The active area is the cross-sectional area of drift layer 54 through which current flows. When a device comprises a plurality of cells of the type shown on either side of the centerline in FIG. 2A, the total active area is the sum of the individual active areas of the cells.

In the alternative embodiment of the invention illustrated in FIG. 3, device 80 is a vertical bipolar power transistor with an integral Schottky diode for conducting reverse current. The device comprises an N+ substrate 82 with a metallic collector electrode 86 on the bottom surface of the substrate. An epitaxially-grown N-type conductivity collector layer 84 is situated on the top surface of substrate 82. A P-base region 88 is diffused into the top surface of N-layer 84. Metallic base electrodes 89 are in contact with base region 88. An N+ emitter region 94 is diffused into base region 88 and is in emitter electrode 97 forms a Schottky barrier $J_s$ with collector layer 84 and is externally connected to emitter electrode 96.

Device 80 can operate in a forward blocking mode, a forward conducting mode, or a reverse conducting mode. In the forward blocking mode, junction $J_2$ between emitter region 94 and base region 88 is not forward biased. This condition occurs, for example, if the base and emitter electrodes are short-circuited. Because junction $J_2$ is not forward biased, there is no minority carrier injection across junction $J_2$ into base region 88. If a positive voltage is now applied to collector electrode 86, junction $J_1$ between P-base region 88 and N-layer 84 becomes reverse biased and no current flows between collector and emitter. In particular, channel region 90 of layer 84 situated interiorly of, or surrounded by, P-base region 88 is of width W chosen so that the region is pinched off by depletion regions surrounding the reverse-biased junction $J_1$, thereby preventing flow of any leakage current through Schottky barrier $J_s$.

If the emitter-base junction $J_2$ is now forward biased, minority carriers (i.e., electrons in this case) are injected into P-base region 88 from N+ emitter 94. These minority carriers diffuse across the P-base and are collected by the reverse-biased junction $J_1$. This is the so-called active gain mode of operation. If junction $J_1$ is not reverse biased, injection into the base will take place from both emitter region 94 and N-layer 84. In this case, the transistor is in the forward conducting mode and current flows from collector to emitter. The terminal current levels are now controlled by circuit elements external to transistor 80 of FIG. 3.

In the reverse conduction mode, Schottky barrier $J_s$ is used to short-circuit the collector-base-emitter structure of transistor 80. In particular, transistor 80 operates in the reverse conduction mode when the Schottky barrier is forward biased. Specifically, by appropriate selection of the area of electrode 97, the Schottky barrier is fabricated so that it turns on at a slightly lower voltage than P-N junction $J_1$. For example, junction $J_1$ turns on at about 0.7 volts so the Schottky barrier may be designed to turn on at 0.6 volts. This allows Schottky barrier $J_s$ to be forward biased without forward biasing junction $J_1$. In this case, reverse current flows only through Schottky barrier $J_s$ and involves majority carriers almost exclusively. For this reason, the Schottky barrier exhibits excellent reverse recovery characteristics without forward voltage overshoot. (Because junction $J_1$ is not forward biased, there is no possibility of conduction via reverse transistor action wherein collector layer 84 serves as the emitter and emitter region 94 serves as collector.)

Illustratively, when device 80 is implemented in silicon, N+ substrate 82 may have a thickness of 500 microns and a dopant concentration of $10^{20}$ per $cm^3$. N epitaxial layer 84 may have a thickness of 20 microns and a dopant concentration of $10^{15}$ per $cm^3$. The P-base region may be diffused to a depth of about 5 microns and have a dopant concentration of about $10^{18}$ per $cm^3$. Distance W may be about 5 microns. Similarly, N+ emitter region 94 may be diffused to a depth on the order of 2 microns and have a dopant concentration on the order of $10^{20}$ per $cm^3$. Collector electrode 86 may be comprised of nickel, while base electrodes 89 and emitter electrodes 96 may be comprised of aluminum. Emitter electrode 97 which forms the Schottky barrier with layer 84 may be comprised of aluminum or tungsten.

Heretofore, device 80 has been described as being fabricated by starting with a heavily doped substrate on which a less heavily doped layer 84 is epitaxially grown. However, it is also possible to fabricated devices of the type shown in FIG. 3 by starting with a wafer doped to a level corresponding to that of layer 84. Diffusion may then be used to form a heavily doped region 82 to which the collector electrode is attached.

While only certain preferred features of the invention have been illustrated and described herein, many modifications and changes will occur to those skilled in the art. It is therefore to be understood that the appended claims are intended to cover all such modifications and changes as fall within the spirit of the invention.

We claim:

1. A high power semiconductor device comprising:
   a heavily doped semiconductor substrate of a first conductivity type;
   first electrode means formed on a first surface of said substrate;
   a semiconductor layer of said first conductivity type situated on a second surface of said substrate so as to form an interface therewith, said layer being less heavily doped than said substrate;
   a base region of a second conductivity type extending into said layer from the surface thereof opposite said interface, said base region being shaped to at least partially surround a portion of said surface of said layer, said base region forming a P-N junction with said layer;
   second electrode means overlying said surface of said layer at least partially surrounded by said base region and forming a Schottky barrier with said layer;
   a heavily doped region of said first conductivity type extending into said base region from said surface of said layer;
   third electrode means in contact with said heavily doped region; and
   fourth electrode means in contact with said base region.

2. The device of claim 1 wherein said second electrode means contacts said at least partially surrounded portion of said surface of said layer to an extent short of reaching said base region.

3. The device of claim 2 wherein said extent of contact between said second electrode means and said at least partially surrounded portion of said surface is selected to provide said Schottky barrier with a lower turn-on voltage than turn-on voltage of said P-N junction.

4. The device of claim 1 including means interconnecting said second and third electrode means.

5. The device of claim 2 including means interconnecting said second and third electrode means.

6. The device of claim 3 including means interconnecting said second and third electrode means.

7. The device of claim 6 wherein said means interconnecting said second and third electrode means is situated external to the semiconductor material of said device.

* * * * *